(12) United States Patent
Happ et al.

(10) Patent No.: US 7,825,398 B2
(45) Date of Patent: Nov. 2, 2010

(54) MEMORY CELL HAVING IMPROVED MECHANICAL STABILITY

(75) Inventors: Thomas D. Happ, Dresden (DE); Yi-Chou Chen, Hsinchu (TW); Jan Boris Philipp, Peekskill, NY (US); Hsiang-Lan Lung, Elmsford, NY (US)

(73) Assignees: Macronix International Co., Ltd., Hsinchu (TW); Qimonda A.G., Munich (DE)

( * ) Notice: Subject to any disclaimer, the term of this patent is extended or adjusted under 35 U.S.C. 154(b) by 218 days.

(21) Appl. No.: 12/098,556

(22) Filed: Apr. 7, 2008

(65) Prior Publication Data

US 2009/0251944 A1 Oct. 8, 2009

(51) Int. Cl.
*H01L 47/00* (2006.01)
(52) U.S. Cl. .............. 257/4; 257/E45.002; 438/102; 438/621; 438/642; 438/652; 438/666; 365/148
(58) Field of Classification Search ............. 438/102, 438/621, 642, 652, 666; 257/4, E45.002; 365/148
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |

(Continued)

FOREIGN PATENT DOCUMENTS

WO   WO-0079539   12/2000

(Continued)

OTHER PUBLICATIONS

"Magnetic Bit Boost," www.sciencenews.org, Dec. 18 & 25, 2004, p. 389, vol. 166.

(Continued)

*Primary Examiner*—Tu-Tu V Ho
(74) *Attorney, Agent, or Firm*—Haynes Beffel & Wolfeld LLP

(57) ABSTRACT

Memory cells are described along with methods for manufacturing. A memory cell described herein includes a bottom electrode comprising a base portion and a pillar portion on the base portion, the pillar portion and the base portion having respective outer surfaces and the pillar portion having a width less than that of the base portion. A memory element is on a top surface of the pillar portion of the bottom electrode, and a top electrode is on the memory element. A dielectric spacer contacts the outer surface of the pillar portion, the outer surface of the base portion of the bottom electrode self-aligned with an outer surface of the dielectric spacer.

17 Claims, 14 Drawing Sheets

U.S. PATENT DOCUMENTS

| | | | |
|---|---|---|---|
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,902,704 A | 5/1999 | Schoenborn et al. | |
| 5,920,788 A | 7/1999 | Reinberg | |
| 5,933,365 A | 8/1999 | Klersy et al. | |
| 5,952,671 A | 9/1999 | Reinberg et al. | |
| 5,958,358 A | 9/1999 | Tenne et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan et al. | |
| 6,025,220 A | 2/2000 | Sandhu | |
| 6,031,287 A | 2/2000 | Harshfield | |
| 6,034,882 A | 3/2000 | Johnson et al. | |
| 6,046,951 A | 4/2000 | El Hajji et al. | |
| 6,066,870 A | 5/2000 | Siek | |
| 6,077,674 A | 6/2000 | Schleifer et al. | |
| 6,077,729 A | 6/2000 | Harshfield | |
| 6,087,269 A | 7/2000 | Williams | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,280,684 B1 | 8/2001 | Yamada et al. | |
| 6,287,887 B1 | 9/2001 | Gilgen | |
| 6,291,137 B1 | 9/2001 | Lyons et al. | |
| 6,314,014 B1 | 11/2001 | Lowrey et al. | |
| 6,316,348 B1 | 11/2001 | Fu et al. | |
| 6,320,786 B1 | 11/2001 | Chang et al. | |
| 6,326,307 B1 | 12/2001 | Lindley et al. | |
| 6,329,666 B1 | 12/2001 | Doan et al. | |
| 6,339,544 B1 | 1/2002 | Chiang et al. | |
| 6,351,406 B1 | 2/2002 | Johnson et al. | |
| 6,372,651 B1 | 4/2002 | Yang et al. | |
| 6,380,068 B2 | 4/2002 | Jeng et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,440,837 B1 | 8/2002 | Harshfield | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,514,820 B2 | 2/2003 | Ahn et al. | |
| 6,534,781 B2 | 3/2003 | Dennison | |
| 6,545,903 B1 | 4/2003 | Wu | |
| 6,551,866 B1 | 4/2003 | Maeda et al. | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,576,546 B2 | 6/2003 | Gilbert et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,596,589 B2 | 7/2003 | Tseng et al. | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,674,115 B2 | 1/2004 | Hudgens et al. | |
| 6,677,678 B2 | 1/2004 | Biolsi et al. | |
| 6,744,088 B1 | 6/2004 | Dennison | |
| 6,750,079 B2 | 6/2004 | Lowrey et al. | |
| 6,750,101 B2 | 6/2004 | Lung et al. | |
| 6,791,102 B2 | 9/2004 | Johnson et al. | |
| 6,797,979 B2 | 9/2004 | Chiang et al. | |
| 6,800,504 B2 | 10/2004 | Li et al. | |
| 6,805,563 B2 | 10/2004 | Ohashi et al. | |
| 6,815,704 B1 | 11/2004 | Chen | |
| 6,838,692 B1 | 1/2005 | Lung et al. | |
| 6,850,432 B2 | 2/2005 | Lu et al. | |
| 6,859,389 B2 | 2/2005 | Idehara et al. | |
| 6,861,267 B2 | 3/2005 | Xu et al. | |
| 6,864,500 B2 | 3/2005 | Gilton | |
| 6,864,503 B2 | 3/2005 | Lung et al. | |
| 6,867,638 B2 | 3/2005 | Saiki et al. | |
| 6,881,603 B2 | 4/2005 | Lai | |
| 6,888,750 B2 | 5/2005 | Walker et al. | |
| 6,894,304 B2 | 5/2005 | Moore | |
| 6,894,305 B2 | 5/2005 | Yi et al. | |
| 6,900,517 B2 | 5/2005 | Tanaka et al. | |
| 6,903,362 B2 | 6/2005 | Wyeth et al. | |
| 6,909,107 B2 | 6/2005 | Rodgers et al. | |
| 6,910,907 B2 | 6/2005 | Layadi et al. | |
| 6,927,410 B2 | 8/2005 | Chen | |
| 6,928,022 B2 | 8/2005 | Cho et al. | |
| 6,933,516 B2 | 8/2005 | Xu | |
| 6,936,544 B2 | 8/2005 | Huang et al. | |
| 6,936,840 B2 | 8/2005 | Sun et al. | |
| 6,937,507 B2 | 8/2005 | Chen | |
| 6,943,365 B2 | 9/2005 | Lowrey et al. | |
| 6,969,866 B1 | 11/2005 | Lowrey et al. | |
| 6,972,428 B2 | 12/2005 | Maimon | |
| 6,972,430 B2 | 12/2005 | Casagrande et al. | |
| 6,977,181 B1 | 12/2005 | Raberg et al. | |
| 6,992,932 B2 | 1/2006 | Cohen et al. | |
| 7,023,009 B2 | 4/2006 | Kostylev et al. | |
| 7,033,856 B2 | 4/2006 | Lung et al. | |
| 7,038,230 B2 | 5/2006 | Chen et al. | |
| 7,038,938 B2 | 5/2006 | Kang et al. | |
| 7,042,001 B2 | 5/2006 | Kim et al. | |
| 7,067,837 B2 | 6/2006 | Hwang et al. | |
| 7,067,864 B2 | 6/2006 | Nishida et al. | |
| 7,067,865 B2 | 6/2006 | Lung et al. | |
| 7,078,273 B2 | 7/2006 | Matsuoka et al. | |
| 7,115,927 B2 | 10/2006 | Hideki et al. | |
| 7,122,281 B2 | 10/2006 | Pierrat | |
| 7,122,824 B2 | 10/2006 | Khouri et al. | |
| 7,126,149 B2 | 10/2006 | Iwasaki et al. | |

| Patent/Pub. No. | Date | Inventor |
|---|---|---|
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,449,710 B2 | 11/2008 | Lung |
| 2002/0070457 A1 | 6/2002 | Sun et al. |
| 2002/0113273 A1 | 8/2002 | Hwang et al. |
| 2003/0072195 A1 | 4/2003 | Mikolajick |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1* | 2/2005 | Harshfield ............... 257/330 |
| 2005/0062087 A1 | 3/2005 | Chen et al. |
| 2005/0093022 A1 | 5/2005 | Lung |
| 2005/0127349 A1 | 6/2005 | Horak et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157681 A1 | 7/2006 | Chen et al. |
| 2006/0163554 A1 | 7/2006 | Lankhorst et al. |
| 2006/0198183 A1 | 9/2006 | Kawahara et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0023887 A1* | 2/2007 | Matsui .................... 257/686 |
| 2007/0030721 A1 | 2/2007 | Segal et al. |
| 2007/0037101 A1 | 2/2007 | Morioka |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |

| | | | |
|---|---|---|---|
| 2008/0179582 | A1 | 7/2008 | Burr et al. |
| 2008/0180990 | A1 | 7/2008 | Lung |
| 2008/0186755 | A1 | 8/2008 | Lung et al. |
| 2008/0191187 | A1 | 8/2008 | Lung et al. |
| 2008/0192534 | A1 | 8/2008 | Lung |
| 2008/0197334 | A1 | 8/2008 | Lung |
| 2008/0224119 | A1 | 9/2008 | Burr et al. |
| 2008/0225489 | A1 | 9/2008 | Cai et al. |
| 2009/0166600 | A1* | 7/2009 | Park et al. ............... 257/3 |
| 2009/0184310 | A1 | 7/2009 | Lung |

FOREIGN PATENT DOCUMENTS

| | | |
|---|---|---|
| WO | WO-0145108 | 6/2001 |
| WO | WO-0225733 | 3/2002 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era- vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates, " Mat. Res. Soc. Symp. Proc., vol. 106, 1998, pp. 21-26.

Yamada, Noboru, "Potential of Ge-Sb-Te phase-change optical disks for high-data-rate recording in the near future," (Conference Proceedings Paper), Jul. 30, 1997, vol. 3109, 10 pages.

\* cited by examiner

MEMORY CELL HAVING IMPROVED MECHANICAL STABILITY

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on programmable resistive materials, including phase change materials like chalcogenides, and to methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state. It is desirable to minimize the magnitude of the reset current used to cause transition of phase change material from the crystalline state to the amorphous state. The memory cells using phase change material include an "active region" in the bulk of the phase change material of the cell in which the actual phase transition is located. Techniques are applied to make the active region small, so that the amount of current needed to induce the phase change is reduced. Also, techniques are used to thermally isolate the active region in the phase change cell so that the resistive heating needed to induce the phase change is confined to the active region.

The magnitude of the current needed for reset can be reduced by reducing the size of the phase change material element in the cell and/or the contact area between electrodes and the phase change material, such that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovishinsky, "Multibit Single Cell Memory Element Tapered Contact", U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064 issued Aug. 6, 2002 to Wicker, "Reduced Contact Areas of Sidewall Conductor"; U.S. Pat. No. 6,462,353 issued Oct. 8, 2002 to Gilgen, "Method for Fabricating a Small Area of Contact Between Electrodes"; U.S. Pat. No. 6,501,111 issued Dec. 31, 2002 to Lowrey, "Three-Dimensional (3D) Programmable Device"; U.S. Pat. No. 6,563,156 issued Jul. 1, 2003 to Harshfield, "Memory Elements and Methods for Making Same."

One problem associated with manufacturing devices having very small electrodes arises because of poor adhesion of the very small electrodes, which can cause the bottom electrode to fall over during manufacturing.

A bottom electrode having an inverted T-shape has been proposed (U.S. patent application Ser. No. 12/016,840, filed 18 Jan. 2008 entitled Memory Cell with Memory Element Contacting an Inverted T-Shaped Bottom Electrode) having a small contact area between the bottom electrode and memory material, resulting in a small active region and reducing the amount of power needed for reset of the memory cell. The inverted T-shaped bottom electrode also improves the mechanical stability of the bottom electrode during manufacturing, thereby improving the manufacturing yield of such devices.

It is desirable therefore to provide a reliable method for manufacturing a memory cell structure with good control over the critical dimensions of the bottom electrode while also addressing the mechanical stability issues of very small electrodes, which will work with high density integrated circuit memory devices.

SUMMARY

A memory cell described herein includes a bottom electrode comprising a base portion and a pillar portion on the base portion, the pillar portion and the base portion having respective outer surfaces and the pillar portion having a width less than that of the base portion. A memory element is on a top surface of the pillar portion of the bottom electrode, and a top electrode is on the memory element. A dielectric spacer contacts the outer surface of the pillar portion, the outer surface of the base portion of the bottom electrode self-aligned with an outer surface of the dielectric spacer.

A method for manufacturing a memory cell as described herein includes forming a memory core including a bottom electrode comprising a base portion and a pillar portion on the base portion, the pillar portion and the base portion having respective outer surfaces and the pillar portion having a width less than that of the base portion. The memory core also includes a memory element on a top surface of the pillar portion of the bottom electrode, and a top electrode on the memory element. The method also includes forming a dielectric spacer contacting the outer surface of the pillar portion, the outer surface of the base portion of the bottom electrode self-aligned with an outer surface of the dielectric spacer.

A method for manufacturing a memory cell as described herein includes providing a memory access layer having a top surface, the memory access layer including a conductive plug extending to the top surface of the memory access layer. A layer of bottom electrode material is formed on the top surface of the memory access layer, a layer of memory material is formed on the layer of bottom electrode material, a layer of top electrode material is formed on the layer of memory material, and an etch mask is formed on the layer of top electrode material. Etching is performed down through a portion of the layer of bottom electrode material using the etch mask. The etching forms a partially etched layer including a pillar of bottom electrode material and a multi-layer stack on the pillar of bottom electrode material. The multi-layer stack comprises a memory element comprising memory material on the pillar of bottom electrode material and a top electrode comprising top electrode material on the memory element. A layer of dielectric spacer material is formed on the partially etched layer and the multi-layer stack. The dielectric spacer is anisotropically etched to form a dielectric spacer contacting an outer surface of the pillar of bottom electrode material and an outer surface of the multi-layer stack. Etching is then performed on the partially etched layer using the dielectric spacer as an etch mask, thereby forming a bottom electrode comprising a base portion and a pillar portion on the base portion.

The larger width of the base portion of the bottom electrodes described herein provide better adhesion of the bottom electrode and reduce the risk of the bottom electrode falling over during manufacturing. Additionally, the design moves a locus of weakness (that is, the plane where the narrower portion of the bottom electrode ends) away from the interface between the bottom electrode and underlying structures to within the bottom electrode material layer.

Other features, aspects and advantages of the present invention can be seen on review of the Figures, the detailed description, and the claims which follow.

DETAILED DESCRIPTION

Figure 1:
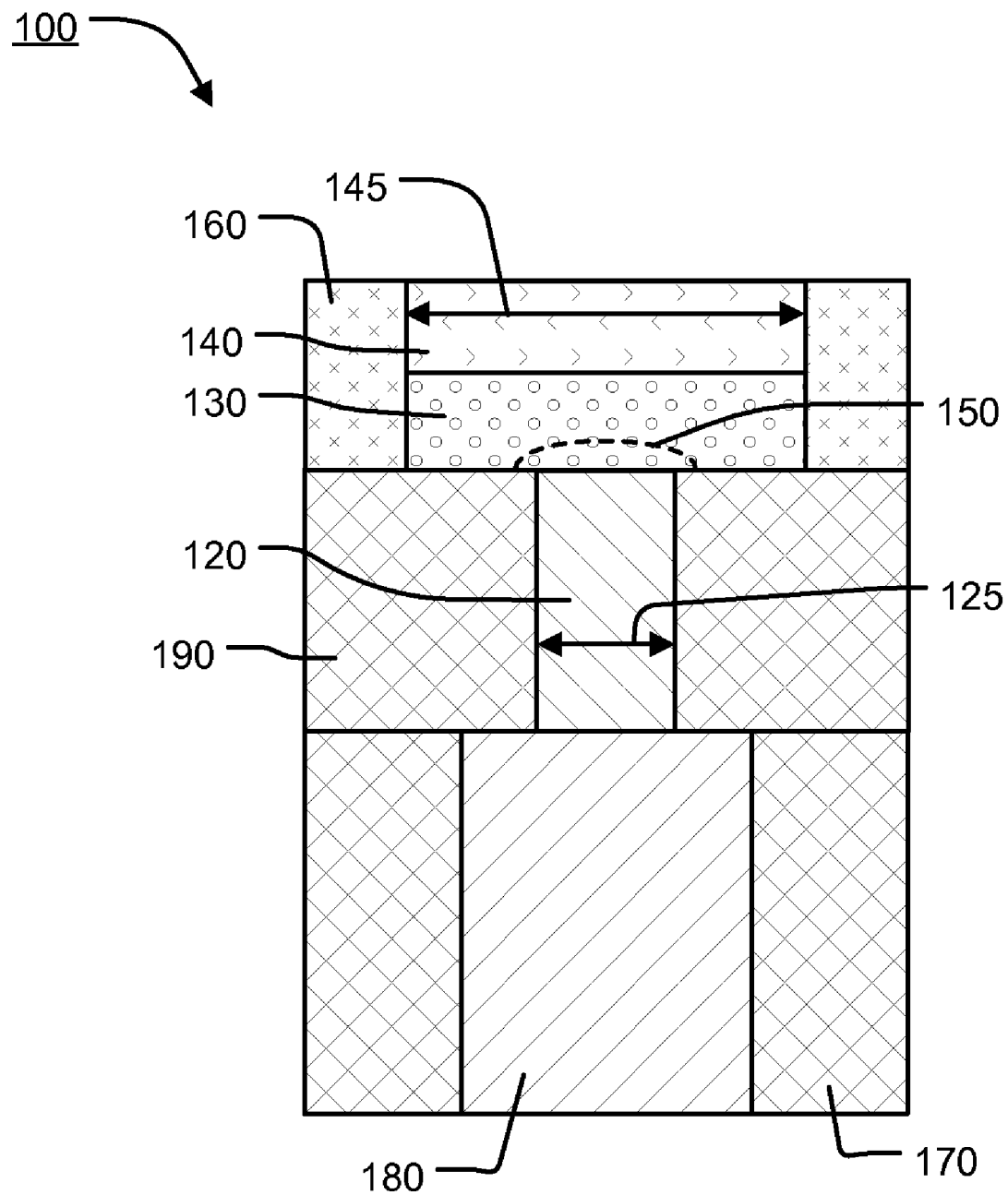
FIG. 1 illustrates a cross-sectional view of a prior art "mushroom" memory cell.

The following description of the disclosure will typically be with reference to specific structural embodiments and methods. It is to be understood that there is no intention to limit the disclosure to the specifically disclosed embodiments and methods but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

A detailed description is provided with reference to FIGS. 1-21.

FIG. 1 illustrates a cross-sectional view of a prior art "mushroom" memory cell 100 having a layer of memory material 130 between a bottom electrode 120 and a top electrode 140. A conductive plug 180 extends through dielectric layer 170 to couple the memory cell 100 to underlying access circuitry (not shown). A dielectric layer 190 surrounds the bottom electrode 120, and a dielectric layer 160 surrounds the top electrode 140 and memory material 130. The bottom electrode 120 has a width 125 less than the width 145 of the top electrode 140 and the memory material 130.

In operation, voltages on the plug 180 and the top electrode 140 can induce current to flow from the plug 180 to the top electrode 140, or vice-versa, via the bottom electrode 120 and the memory material 130.

Due to the differences in the widths 125 and 145, in operation the current density will be largest in the region of the memory material 130 adjacent the bottom electrode 120, resulting in the active region 150 of the memory material 130 having a "mushroom" shape as shown in FIG. 1.

It is desirable to minimize the width 125 (which in some examples is a diameter) of the bottom electrode 120 so that higher current densities are achieved with small absolute current values through the memory material 130.

However, attempts to reduce the width 125 can result in issues in the electrical and mechanical reliability of the interface between the bottom electrode 120 and the plug 180 due to the small contact surface therebetween.

Figure 2:
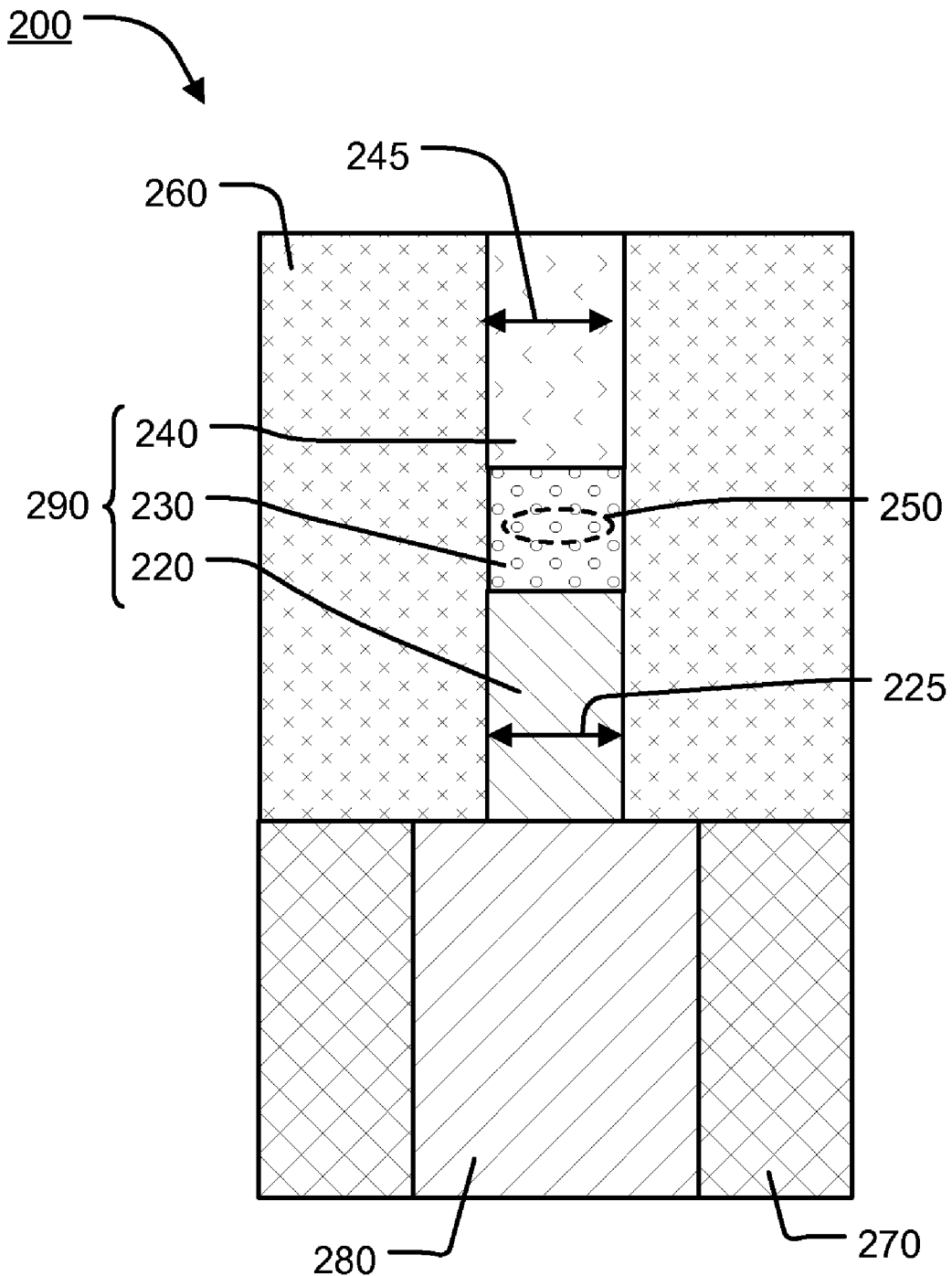
FIG. 2 illustrates a cross-sectional view of a prior art "pillar-type" memory cell.

FIG. 2 illustrates a cross-sectional view of a prior art "pillar-type" memory cell 200. The memory cell 200 includes a multi-layer pillar 290 comprising a bottom electrode 220, a pillar of memory material 230 on the bottom electrode 220, and a top electrode 240 on the pillar of memory material 230. A dielectric layer 260 surrounds the pillar of memory material 230. A conductive plug 280 extends through dielectric layer 270 to couple the memory cell 200 to underlying access circuitry (not shown).

As can be seen in the Figure the top and bottom electrodes 240, 220 have the same width 245 as that of the pillar of memory material 230. Thus, the active region 250 can be spaced away from the top and bottom electrodes 220, 240.

The multi-layer pillar 290 can be formed by sequentially forming a layer of bottom electrode material, a layer of memory material on the bottom electrode material, a layer of top electrode material on the layer of memory material, and subsequently etching to form the pillar 290. However, problems have arisen in manufacturing such devices having small widths 245 and aggressive aspect ratios due to issues with undercut etching and/or overetching. Additionally, attempts to reduce the width 245 can result in issues in the electrical and mechanical reliability of the interface between the bottom electrode 220 and the plug 280 due to the small contact surface therebetween.

Figure 3:
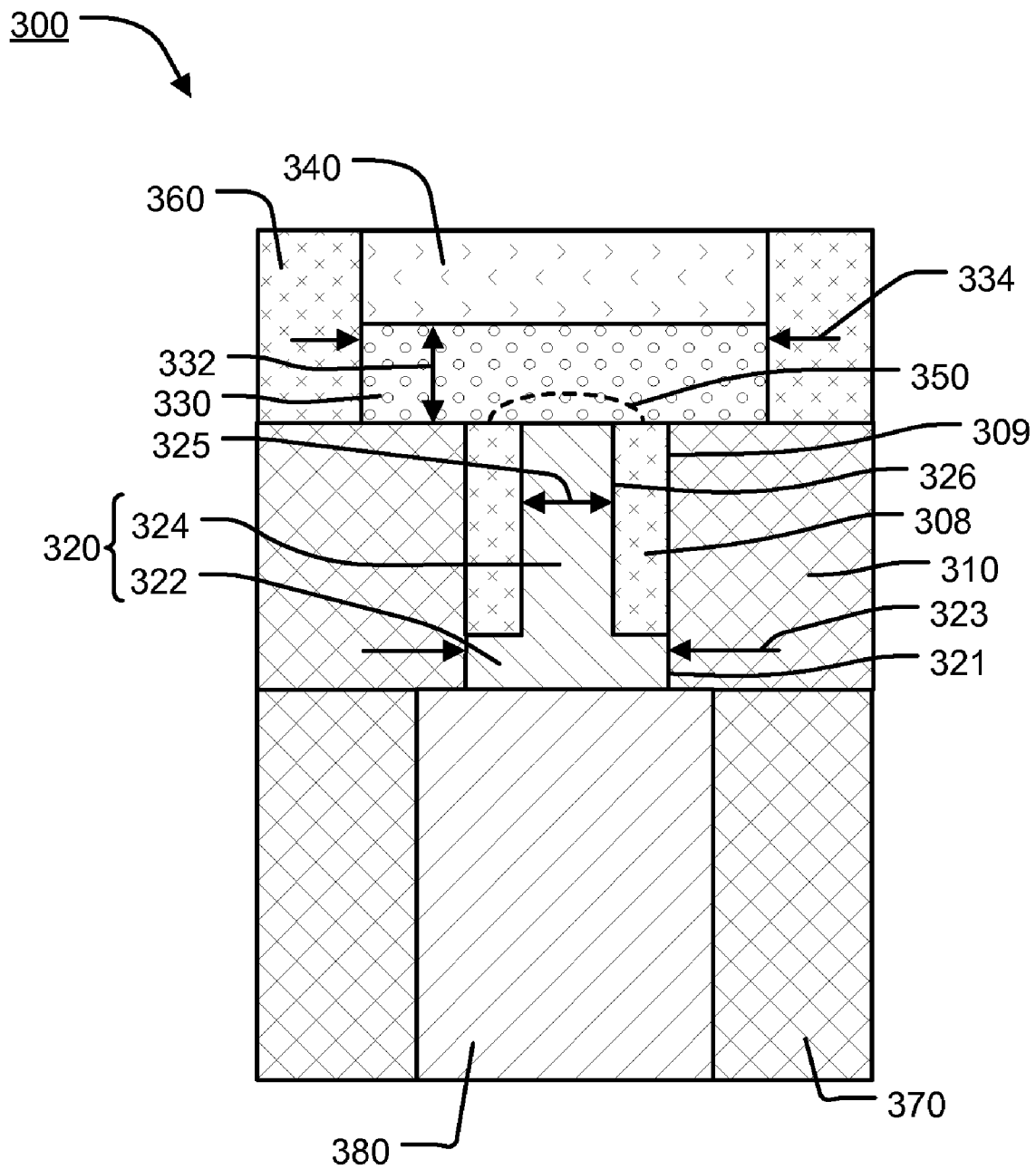
FIG. 3 illustrates a cross-sectional view of a memory cell having improved mechanical stability compared to the memory cell of FIG. 1.

FIG. 3 illustrates a cross-sectional view of a memory cell 300 addressing the issues describes above and resulting in improved mechanical stability compared to the memory cell of FIG. 1. The memory cell 300 includes an inverted T-shaped bottom electrode 320 having a base portion 322 and a pillar portion 324 on the base portion 322. The base portion 322 has a first width 323 (which in some embodiments is a diameter) and the pillar portion 324 has a second width 325 (which in some embodiments is a diameter) less than the first width 323. The larger width 323 of the base portion 322 of the bottom electrode 320 provides better mechanical stability for the bottom electrode 320.

The top surface of the pillar portion 324 contacts a memory element 330, the bottom electrode 320 coupling the memory element 330 to the conductive plug 380. The bottom electrode 320 may comprise, for example, TiN or TaN. TiN may be preferred in embodiments in which the memory element 330 comprises GST (discussed below) because is makes a good contact with GST, it is a common material used in semiconductor manufacturing, and it provides a good diffusion barrier at the higher temperatures at which GST transitions, typically in the 600-700° C. range. Alternatively, the bottom electrode may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

The conductive plug 380 extends through dielectric layer 370 to underlying access circuitry (not shown), the conductive plug 380 comprising a refractory metal such as tungsten in the illustrated embodiment. Other metals that could be used include Ti, Mo, Al, Ta, Cu, Pt, Ir, La, Ni, and Ru. Other plug structures and materials can be used as well.

A top electrode 340 contacts the memory element 330, the top electrode 340 comprising a conductive material such as one or more of the materials described above with reference to the bottom electrode 320. The top electrode 340 may comprise a portion of bit line. Alternatively, a conductive via (not shown) may couple the top electrode 340 to a bit line. The bottom electrode 320, memory element 330, and top electrode 340 form a memory core of the memory cell 300.

A dielectric spacer 308 contacts the outer surface 326 of the pillar portion 324 and surrounds the pillar portion 324. During formation of the bottom electrode 320, the dielectric spacer 308 protects the base portion 322 of the bottom electrode 320 from being etched. Thus, the base portion 322 has an outside surface 321 self-aligned with the outside surface 309 of the dielectric spacer 308.

Dielectric 310 surrounds the dielectric spacer 308 and the base portion 322 of the bottom electrode 320. The dielectric spacer 308 and dielectric 310 each preferably comprise material resistant to diffusion of the phase change material of memory element 330, and in some embodiments the spacer 308 and dielectric 310 comprise the same material. Alternatively, the material of dielectric spacer 308 can be chosen, for example, for low thermal conductivity (discussed in more detail below) and/or for use in selective processing (for example selective etching) during the formation of the memory cell 300 (discussed in more detail with reference to FIGS. 5-13).

The dielectric spacer 308 may comprise an electrical insulator including one or more elements selected from the group consisting of Si, Ti, Al, Ta, N, O, and C. In preferred devices, the dielectric materials have a low thermal conductivity, less than about 0.014 J/cm*K*sec. In other preferred embodiments, when memory element 330 is made from a phase change material, the dielectric spacer 308 comprises material having a thermal conductivity less than that of the amorphous state of the phase change material, or less than about 0.003 J/cm*K*sec for a phase change material comprising GST. Representative thermally insulating materials include materials that are a combination of the elements silicon (Si), carbon (C) oxygen (O), fluorine (F), and hydrogen (H). Examples of thermally insulating materials which are candidates for use for the thermally insulating dielectric 308 include $SiO_2$, SiCOH, polyimide, polyamide, and fluorocarbon polymers. Other examples of materials which are candidates for use for the thermally insulating dielectric materials include fluorinated $SiO_2$, silsesquioxane, polyarylene ethers, parylene, fluoro-polymers, fluorinated amorphous carbon, diamond like carbon, porous silica, mesoporous silica, porous silsesquioxane, porous polyimide, and porous polyarylene ethers. In other embodiments, the thermally insulating structure comprises a gas-filled void for thermal insulation. A single layer or combination of layers within the dielectric materials can provide thermal and electrical insulation. In the manufacturing process described in FIGS. 5-12 below, the dielectric spacer 308 may also act as an etch mask, and thus may be chosen for its selective etching characteristics.

A dielectric 360 surrounds the memory element 330, and in some embodiments the dielectric 360 comprises the same material as that of the dielectric 310.

In operation, voltages on the plug 380 and the top electrode 340 can induce a current to flow from the plug 380 to the top electrode 340, or vice versa, via the bottom electrode 320 and the memory element 340.

The active region 350 is the region of the memory element 330 in which the memory material is induced to change between at least two solid phases. As can be appreciated, the active region 350 can be made extremely small in the illustrated structure, thus reducing the magnitude of the current needed to induce a phase change. The thickness 332 of the memory material of the memory element 330 can be established using a thin film deposition technique of memory material on the bottom electrode 320. In some embodiments the thickness 332 is less than or equal to about 100 nm, for example being between 10 and 100 nm. Furthermore, the width or diameter 325 of the pillar portion 324 of the bottom electrode 320 is less than the width or diameter 334 of the memory element 330 and is preferably less than a minimum feature size for a process, typically a lithographic process, used to form the memory cell 300. The small pillar portion 324 of the bottom electrode 320 concentrates current density in the portion of the memory element 330 adjacent the bottom electrode 320, thereby reducing the magnitude of the current needed to induce a phase change in the active region 350. Additionally, the dielectric spacer 308 preferably provides some thermal isolation to the active region 350, which also helps to reduce the amount of current necessary to induce a phase change.

The bottom electrode 320 having an inverse T-shape adds mechanical stability in two ways. First, the increased area between the bottom electrode 320 and the plug 380 increases the strength of the unit as a whole. Second, the design moves a locus of weakness (that is, the plane where the narrower portion of the bottom electrode 320 ends) away from the interface between the bottom electrode 320 and the plug 380 to within a monolithic material layer (the bottom electrode 320). In addition, the electrical contact resistance between the bottom electrode 320 and the underlying conductive plug 380 is reduced due to the increased contact area.

Figure 4:
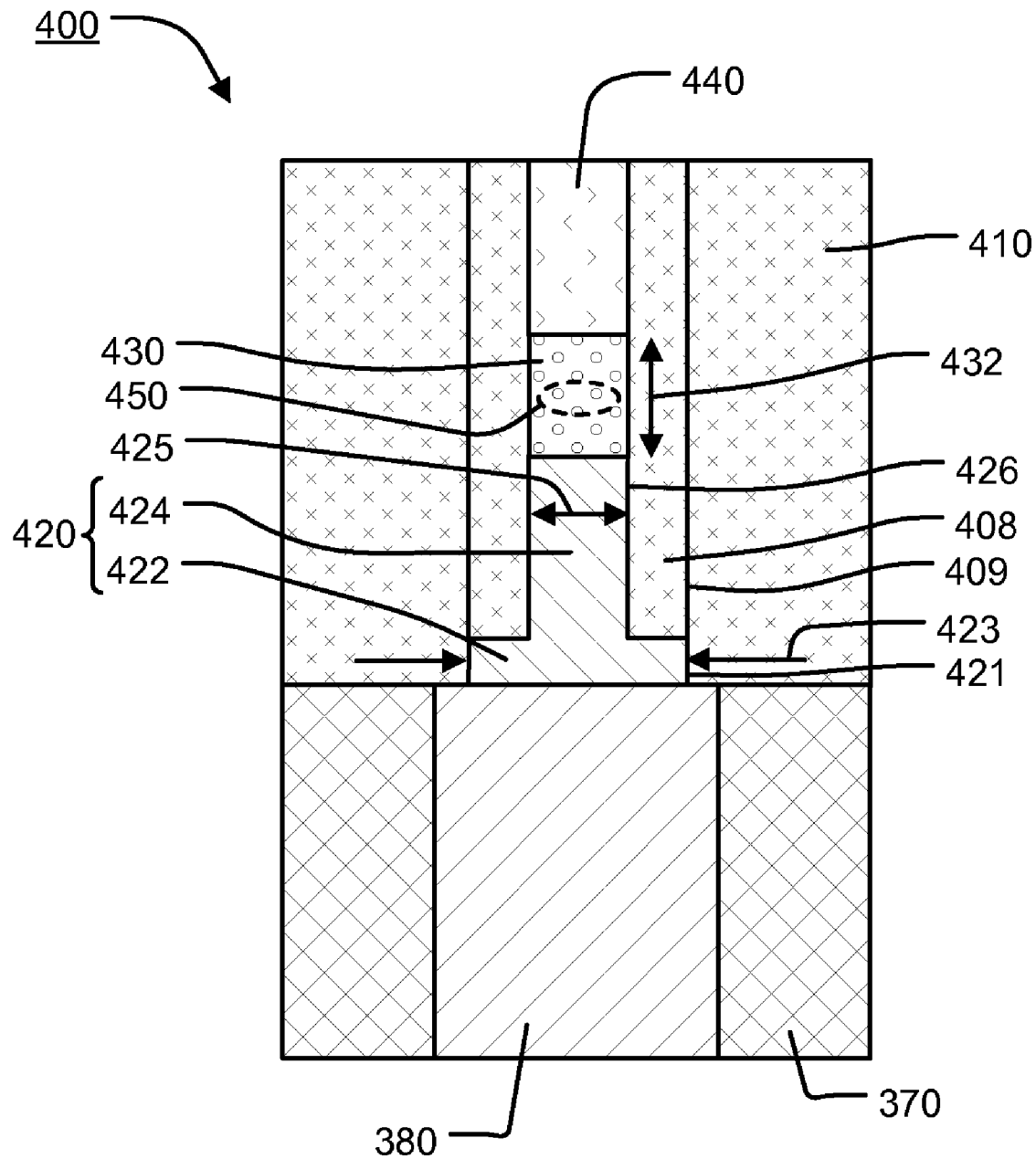
FIG. 4 illustrates a cross-sectional view of a memory cell having improved mechanical stability compared to the memory cell of FIG. 2.

FIG. 4 illustrates a cross-sectional view of a second memory cell 400 having improved mechanical stability compared to the memory cell of FIG. 2. The memory cell includes an inverted T-shaped bottom electrode 420 having a base portion 422 and a pillar portion 424 on the base portion 422. The base portion 422 has a first width 423 (which in some embodiments is a diameter) and the pillar portion 424 has a second width 425 (which in some embodiments is a diameter) less than the first width 423. The larger width 423 of the base portion 422 of the bottom electrode 420 provides better mechanical stability to the bottom electrode 420.

The top surface of the pillar portion 424 contacts a pillar memory element 430 comprising memory material, the bottom electrode 420 coupling the memory element 430 to the conductive plug 380. The bottom electrode 420, for example, may comprise any of the materials of the bottom electrode 320 discussed above with reference to FIG. 3.

As can be seen in FIG. 4, the width of the pillar memory element 430 and the width of a top electrode 440 are substantially equal to the width 425 of the pillar portion 424 of the bottom electrode 420. As used herein, the term "substantially" is intended to accommodate manufacturing tolerances. Thus, the pillar memory element 430 has an active region 450 that can be spaced away from both the top and bottom electrodes 440, 430. The top electrode 440 may comprise, for example, any of the materials of the top electrode 340 described above with reference to FIG. 3. The bottom electrode 420, memory element 430, and top electrode 440 form a memory core of the memory cell 400.

A dielectric spacer 408 contacts the outer surface 426 of the pillar portion 424 and surrounds the pillar portion 424. The dielectric spacer 408 can be used as an etch mask during the formation of the base portion 422 of the bottom electrode 420. Accordingly, the base portion 422 of the bottom electrode 420 has an outer surface 421 self-aligned with the outer surface 409 of the dielectric spacer 408.

The dielectric spacer 408 may comprise, for example, any of the materials discussed above with reference to the dielectric spacer 308 of FIG. 3. The dielectric spacer 408 preferably comprises material resistant to diffusion of the phase change material of memory element 430. In the manufacturing process described in FIGS. 14-19 below the dielectric spacer 408 acts as an etch mask used in the formation of the bottom electrode 420, and thus preferably comprises material that can be selectively etched.

A dielectric 410 surrounds the dielectric spacer 408 and the base portion 422 of the bottom electrode 420. In some embodiments the dielectric spacer 408 and dielectric 410 each comprise the same material. Alternatively, the material of dielectric spacer 408 can be chosen, for example, for low thermal conductivity (discussed in more detail below) and/or for use in selective processing (for example selective etching) during the formation of the memory cell 400 (discussed in more detail below with reference to FIGS. 14-19).

In operation, voltages on the plug 380 and the top electrode 440 can induce a current to flow from the plug 380 to the top electrode 440, or vice versa, via the bottom electrode 420 and the memory element 440.

The active region 450 is the region of the memory element 430 in which the memory material is induced to change between at least two solid phases. As can be appreciated the active region can be made extremely small in the illustrated structure, thus reducing the magnitude of the current needed to induce a phase change. The thickness 432 of the memory material of the memory element 430 can be established using a thin film deposition technique of memory material on the bottom electrode 420. In some embodiments the thickness 432 is less than or equal to about 100 nm, for example being between 10 and 100 nm. Furthermore, the width or diameter 425 of the pillar portion 424 of the bottom electrode 420 is equal to that of the memory element 430 and the top electrode 440. Thus, the active region 450 can be spaced away from the top and bottom electrodes 440, 420 and the remaining portions of the memory element 430 can provide some thermal isolation to the active region 450. Additionally, the width 424 is preferably less than a minimum feature size for a process, typically a lithographic process, used to form the memory cell 400. Also, the dielectric spacer 408 preferably comprises a material which provides some thermal isolation to the active region 450, which also helps to reduce the amount of current necessary to induce a phase change.

The bottom electrode 420 provides additional mechanical stability and improved performance of the interface between the bottom electrode 420 and the plug 380 for the same reasons as described above with reference to FIG. 3.

Embodiments of the memory cells 300, 400 include phase change based memory materials, including chalcogenide based materials and other materials, for the memory elements 330, 430 respectively. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including N2 doped GST, $Ge_xSb_y$, or other material that uses different crystal phase changes to determine resistance; $Pr_xCa_yMnO_3$, $Pr_xSr_yMnO_3$, $ZrO_x$, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, $C_{60}$-TCNQ, TCNQ doped with other metal, or any other polymer material that has a bistable or multi-stable resistance state controlled by an electrical pulse.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The thickness of chalcogenide material depends on the design of cell structure. In general, a chalcogenide material with thickness of higher than 1.5 nm can have a phase change transition so that the material exhibits at least two stable resistance states.

FIGS. 5-13 illustrate steps in a fabrication sequence for manufacturing the memory cell illustrated in FIG. 3.

Figure 5:
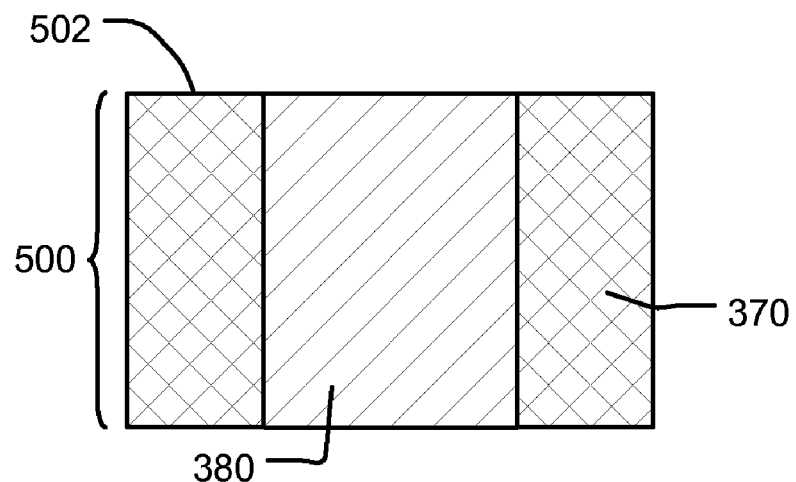
FIGS. 5-13 illustrate steps in a fabrication sequence for manufacturing the memory cell illustrated in FIG. 3.

FIG. 5 illustrates a cross-sectional view of a first step of providing a memory access layer 500 having a top surface 502 and including conductive plug 380 extending through dielectric 370 to the top surface 502. The memory access layer 500 can be formed by standard processes as known in the art, and the configuration of elements of the memory access layer 500 depends upon the array configuration in which the memory cells described herein are implemented. Generally, the memory access layer 500 may include access devices such as transistors, word lines and source lines, conductive plugs, and doped regions within a semiconductor substrate.

Figure 6:
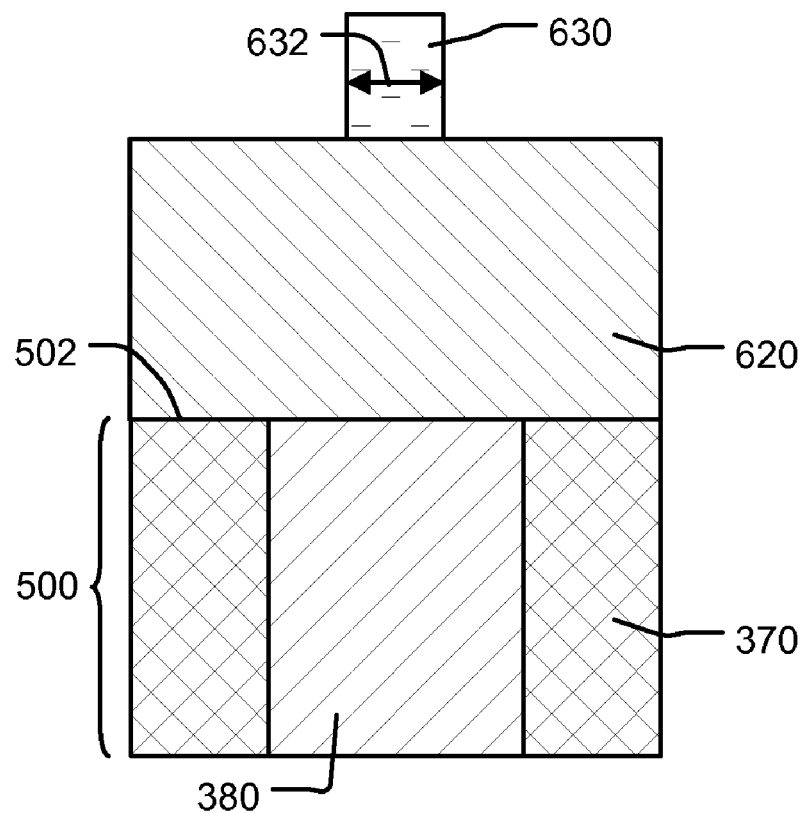

Next, a bottom electrode material layer 620 is formed on the top surface 502 of the memory access layer 500 and an etch mask comprising a mask element 630 is formed on the bottom electrode material layer 620, resulting in the structure illustrated in FIG. 6. The bottom electrode material layer 620 may comprise one or more layers of the materials described above with reference to the bottom electrode 320 of FIG. 3.

The mask element 630 can be formed by patterning a layer of photoresist on the layer 620 using a lithographic process, and then trimming the patterned photoresist to form the mask element 630 having a sub-lithographic width 632, for example being less than 50 nm in some embodiments. Photoresist trimming is applied, for example, using an oxygen plasma to isotropically etch the photoresist and reduces the dimension of the photoresist in both the vertical and horizontal dimensions. In an alternative embodiment, a hard mask layer such as a low temperature deposited layer of SiN or $SiO_2$ can be patterned using photolithography, followed by trimming using an isotropic wet etch, such as dilute HF for silicon dioxide or hot phosphoric acid for silicon nitride, or isotropic fluorine or HBr based reactive ion etching.

Next, anisotropic timing mode etching is performed on the bottom electrode material layer 620 using the mask element 630 as an etch mask, thereby forming partially etched layer 700 comprising the remaining material of the bottom electrode material layer 620. The mask element 630 is then removed, resulting in the structure illustrated in FIG. 7. The layer 700 includes a pillar 710 having a sidewall 711 and underlying the location of mask element 630, the pillar 710 not extending all the way through the layer 700. In one example the pillar 710 has a height 712 of about 40 to 120 nm, for example being about 60 nm high. The remaining portion of the layer 700 has a thickness 720 sufficient to provide the mechanical integrity discussed above.

The timing mode etching may be done, for example, using a chlorine or fluorine based Reactive Ion Etching RIE process. In one embodiment, TiN is anisotropically etched using a chlorine based RIE, and in another embodiment a similar chlorine process is used to anisotropically etch TaN.

Figure 7:
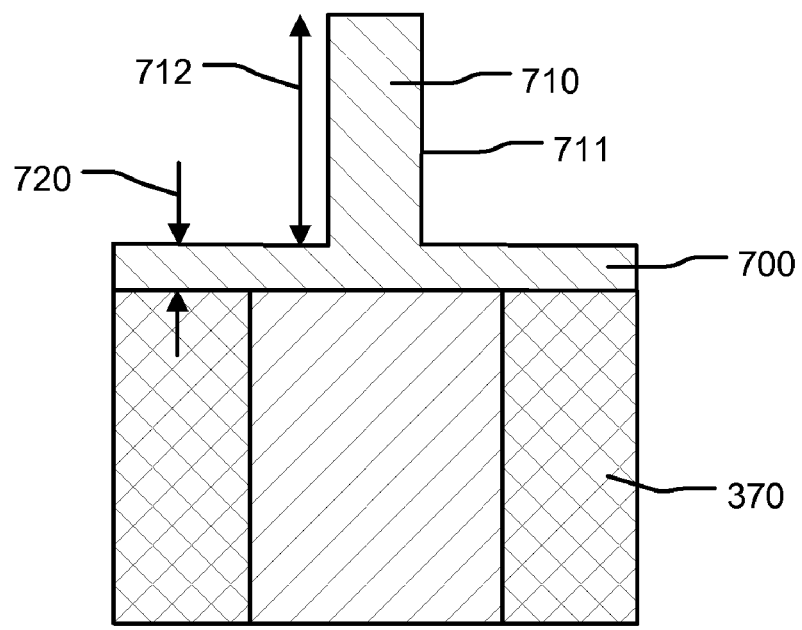
Figure 8:
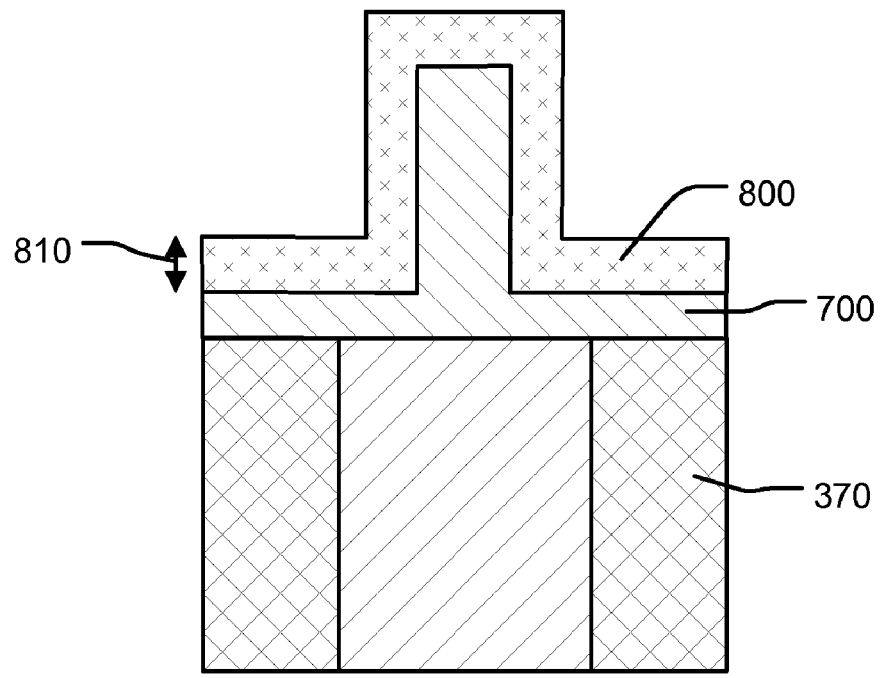

Next, a conformal layer 800 of dielectric spacer material is formed on the structure illustrated in FIG. 7 having a thickness 810, resulting in the structure illustrated in FIG. 8. In the illustrated embodiment layer 800 comprises silicon dioxide and is formed using chemical vapor deposition CVD. Other materials chosen for their etch chemistry and the ability to grow conformal layers on high aspect ratio structures could also be used for the layer 800. Also, other procedures, such as atomic layer deposition, physical layer deposition, low-pressure chemical vapor deposition (LPCVD) of high density plasma chemical vapor deposition (HDPCVD) could be used to deposit the layer 800, depending on the materials and geometries involved.

Figure 9:
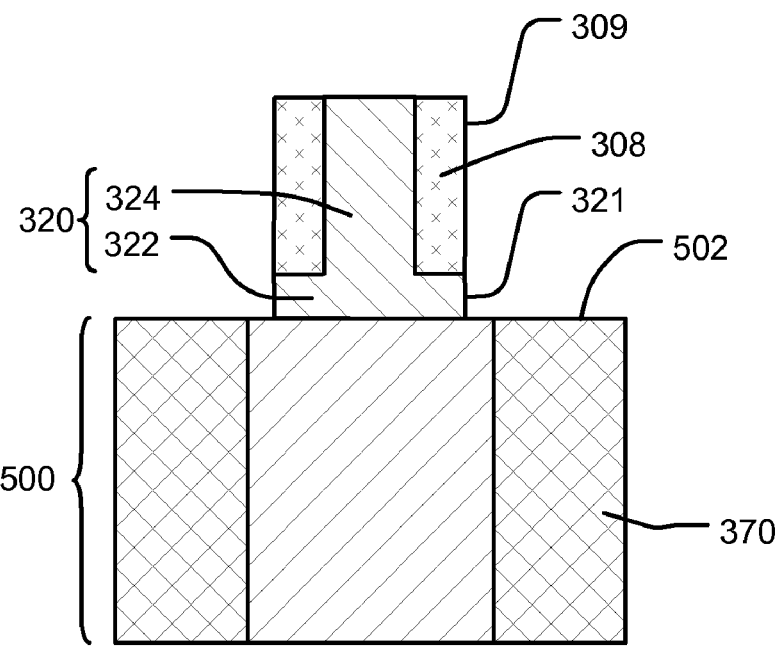

Next, anisotropic etching is performed on the layers 700 and 800 of the structure illustrated in FIG. 8, resulting in the structure illustrated in FIG. 9 having an inverse T-shaped bottom electrode 320 and a dielectric spacer 308.

In the illustration of FIG. 9 the dielectric spacer 308 and the bottom electrode 320 have substantially co-planar top surfaces, although it will be understood that alternatively the top surfaces of the dielectric spacer 308 and the bottom electrode 320 may be other than co-planar after the anisotropic etching process. The relative location of the top surface of the dielectric spacer 308 to that of the bottom electrode 320 depends upon many factors including the thicknesses 720 and 810, the materials of layers 800 and 700, and the etch chemistry used.

During the anisotropic etching the dielectric spacer 308 protects the base portion 322 of the bottom electrode, and thus the base portion 322 of the bottom electrode 320 has an outer surface 321 self-aligned with the outer surface 309 of the dielectric spacer 308.

The anisotropic etching may be performed using a single etching chemistry to etch both layers 700 and 800. Alternatively, the anisotropic etching may comprise a first etch chemistry to anisotropically etch layer 800 to form dielectric spacer 308, and a second etch chemistry to etch layer 700 to form the bottom electrode 320 using the spacer 308 as an etch mask.

Figure 10:
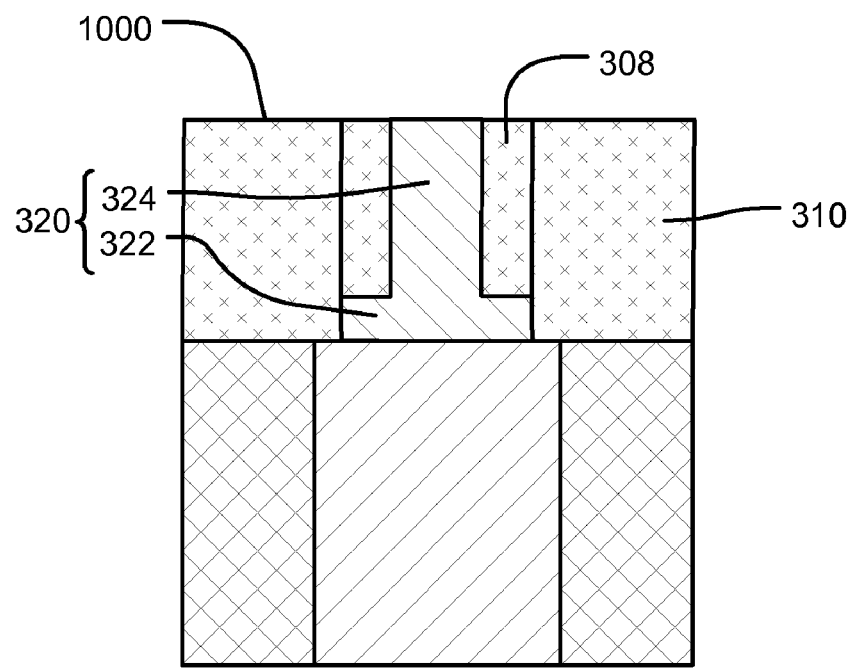

Next, a layer 310 of dielectric material is formed on the structure illustrated in FIG. 9 and planarized, resulting in the structure illustrated in FIG. 10 having a top surface 1000. Layer 310 is formed in one embodiment by high-density plasma chemical vapor deposition (HDP CVD), followed by chemical-mechanical polishing (CMP) to expose the bottom electrode 320. In one embodiment the dielectric 310 comprises silicon dioxide formed by chemical vapor deposition using a silane and $O_2$ chemistry at 400 to 450 C. For embodiments in which the dielectric 310 is silicon nitride, a similar process is used with ammonia added to the silane. For oxynitride, one should use ammonia, silane and oxygen. The dielectric 310 may comprise silicon oxides, silicon nitrides and other insulating materials, preferably having good thermal as well as electrical insulating properties.

Figure 11:
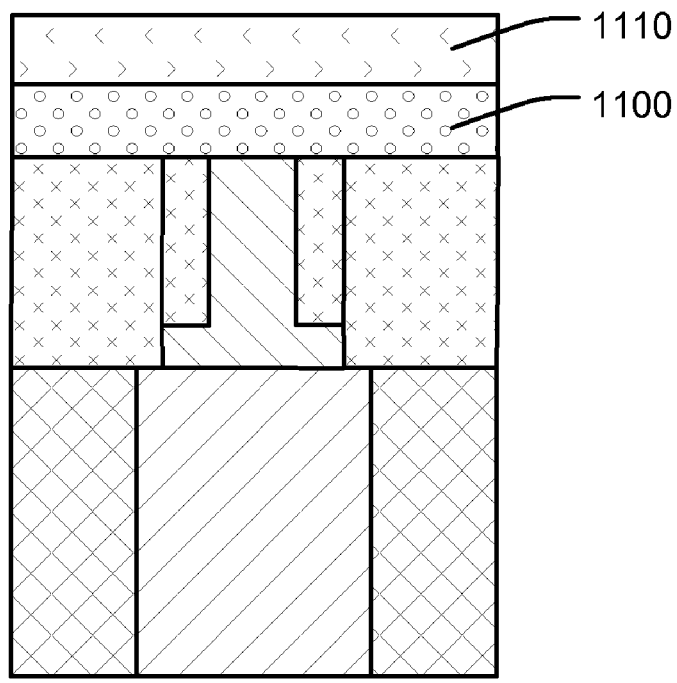

A memory material layer 1100 is then formed on the top surface 1000 and a top electrode material layer 1110 is formed on the memory layer 1100, resulting in the structure illustrated in FIG. 11. The memory layer 1100 and the top electrode layer 1110 can each be less than 100 nm thick, for example being between about 10 and 100 nm thick.

Figure 12:
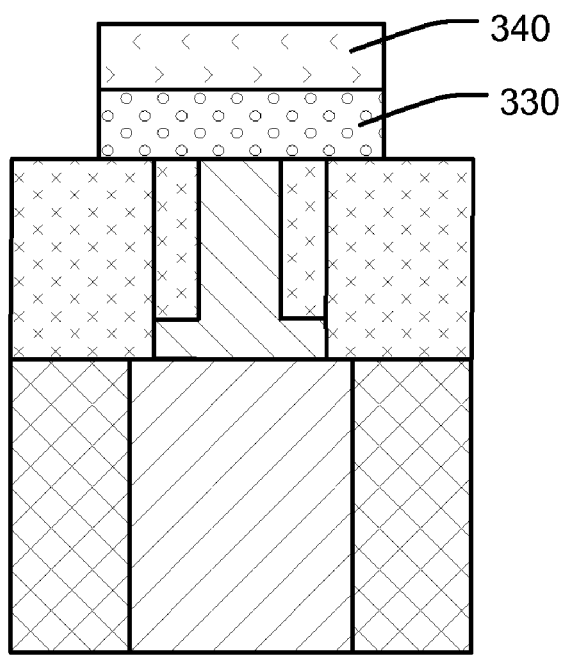

Next, the memory layer 1100 and the top electrode layer 1110 are patterned to form a multi-layer stack comprising a memory element 330 and a top electrode 340, resulting in the structure illustrated in FIG. 12. Alternatively, the memory layer 1100 and the top electrode layer 1110 may be patterned to form bit lines from the top electrode layer 1110. The bottom electrode 320, memory element 330, and top electrode 340 form a memory core.

Figure 13:
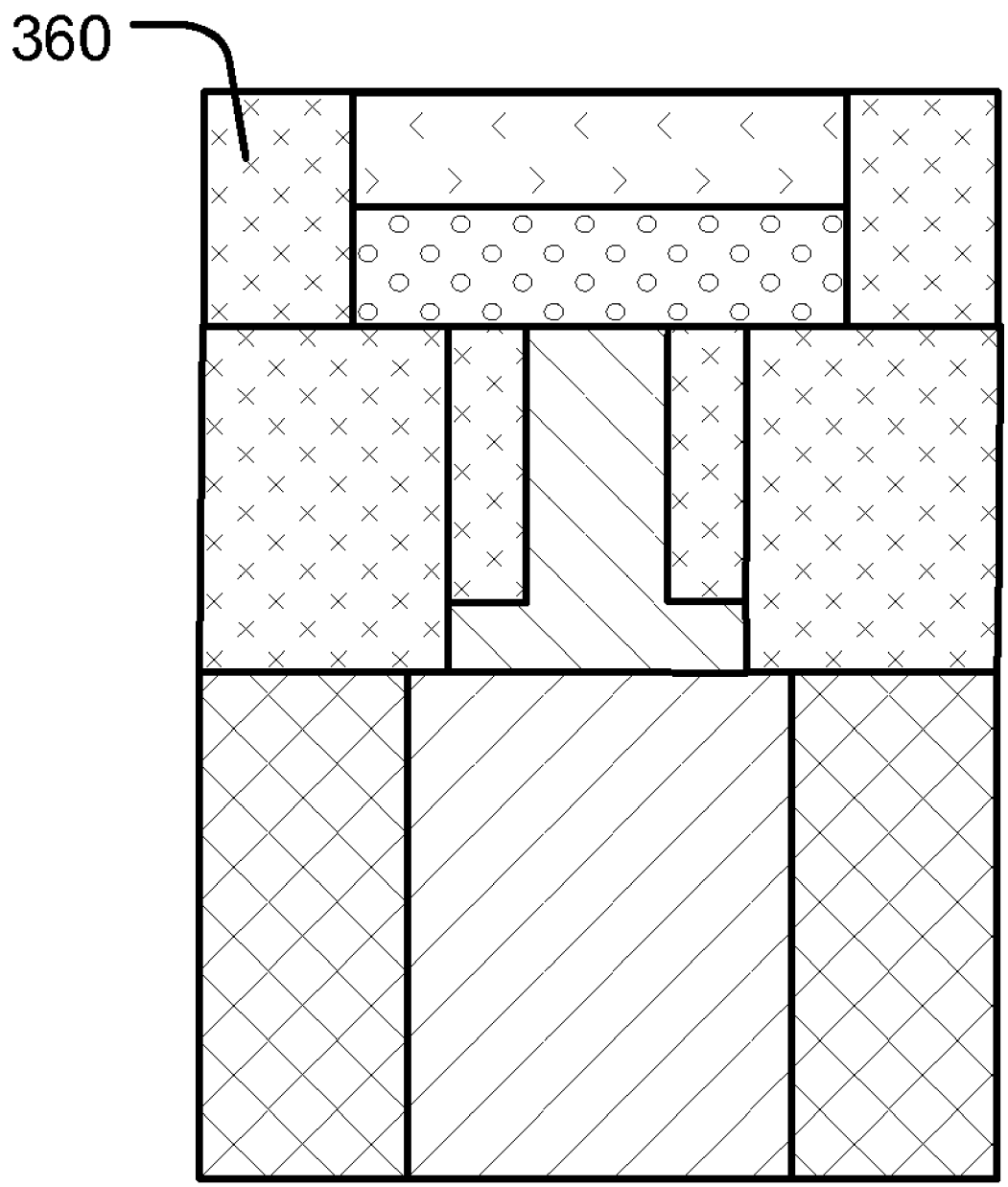

Next, another dielectric layer 360 is formed on the structure illustrated in FIG. 12 and planarized, for example using CMP, resulting in the structure illustrated in FIG. 13.

FIGS. 14-19 illustrate steps in a fabrication sequence for manufacturing the memory cell illustrated in FIG. 4.

Figure 14:
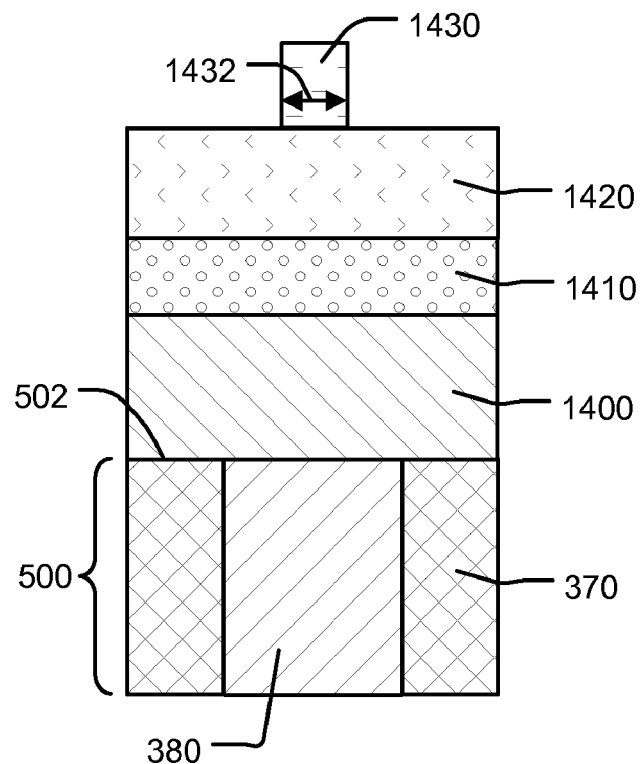
FIGS. 14-19 illustrate steps in a fabrication sequence for manufacturing the memory cell illustrated in FIG. 4.

FIG. 14 illustrates a cross-sectional view of forming a bottom electrode material layer 1400 on the top surface 502 of the access layer 500 of FIG. 5, forming a memory layer 1410 on the bottom electrode material layer 1400, forming a top electrode material layer 1420 on the memory layer 1410, and forming an etch mask comprising a mask element 1430 on the top electrode material layer 1420. The bottom electrode material layer 1400 may comprise one or more layers of the materials described above with reference to the bottom electrode 320 of FIG. 3.

The mask element 1430 can be formed by patterning a layer of photoresist on the layer 1420 using a lithographic process, and then trimming the patterned photoresist to form the mask element 1430 having a sub-lithographic width 1432, for example being less than 50 nm in some embodiments. Photoresist trimming is applied, for example, using an oxygen plasma to isotropically etch the photoresist and reduces the dimension of the photoresist in both the vertical and horizontal dimensions. In an alternative embodiment, a hard mask layer such as a low temperature deposited layer of SiN or $SiO_2$ can be patterned using photolithography, followed by trimming using an isotropic wet etch, such as dilute HF for silicon dioxide or hot phosphoric acid for silicon nitride, or isotropic fluorine or HBr based reactive ion etching.

Next, anisotropic timing mode etching is performed using the mask element 1430 as an etch mask, thereby forming a partially etched layer 1500 comprising the remaining portion of layer 1400 and including pillar 1510 of the bottom electrode material of layer 1400, and forming a multi-layer stack 1530 on pillar 1510. The multi-layer stack 1530 comprises memory element 430 on pillar 1510, and top electrode 440 on the memory element 430. The mask element 1430 is then removed, resulting in the structure illustrated in FIG. 15. The layer 1500 includes a pillar 1510 that does not extend all the way through the layer 1500. The multi-layer stack 1530 has a width substantially equal to that of pillar 1510. The remaining portion of the layer 1500 has a thickness 1520 sufficient to provide the mechanical integrity discussed above.

The timing mode etching may be done using a chlorine or fluorine based Reactive Ion Etching RIE process. In one embodiment, TiN is anisotropically etched using a chlorine based RIE, and in another embodiment a similar chlorine process is used to anisotropically etch TaN.

Figure 15:
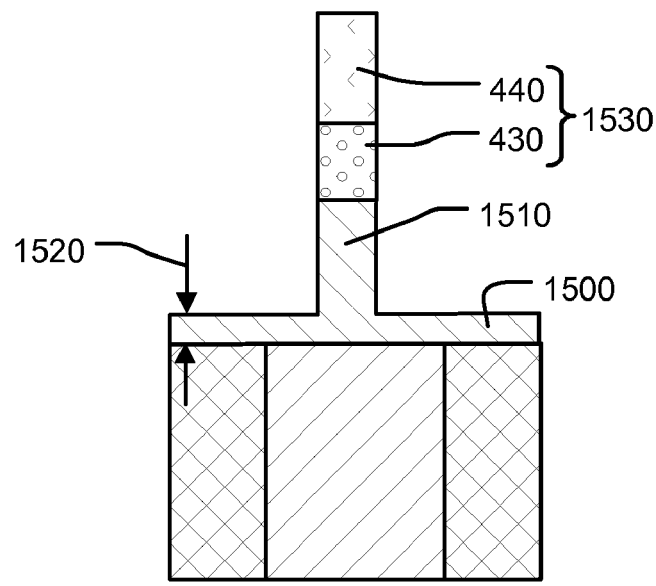
Figure 16:
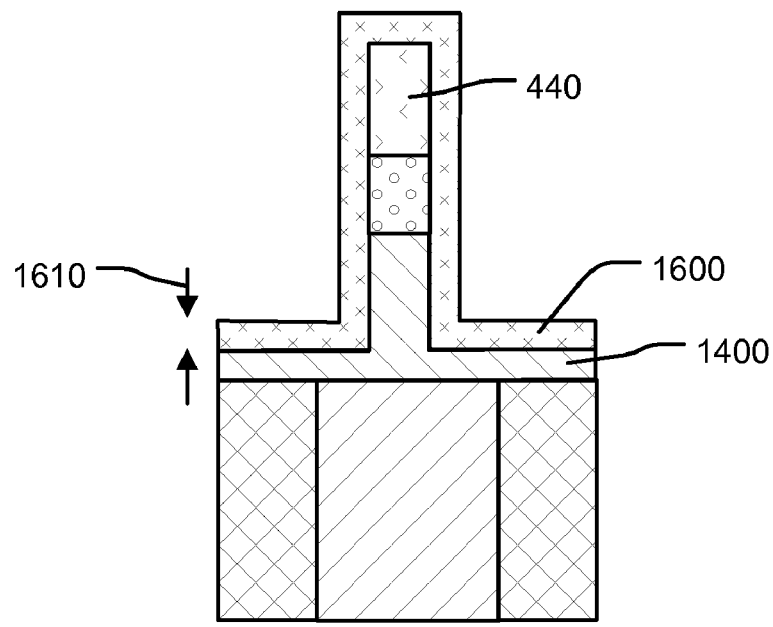

Next, a conformal layer 1600 of dielectric spacer material is formed on the structure illustrated in FIG. 15 having a thickness 1610, resulting in the structure illustrated in FIG. 16. In the illustrated embodiment layer 1600 comprises silicon dioxide and is formed using chemical vapor deposition CVD. Other materials chosen for their etch chemistry and the ability to grow conformal layers on high aspect ratio structures could also be used for the layer 1600. Also, other procedures, such as atomic layer deposition, physical layer deposition, low-pressure chemical vapor deposition (LCPVD) of high density plasma chemical vapor deposition (HDPCVD) could be used to deposit the layer 1600, depending on the materials and geometries involved.

Figure 17:
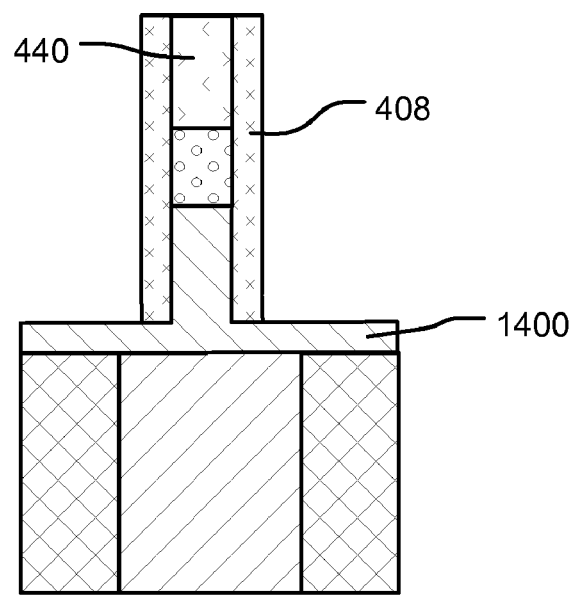

Next, anisotropic etching is performed on the layer 1600 to form dielectric spacer 408, resulting in the structure illustrated in FIG. 17.

Figure 18:
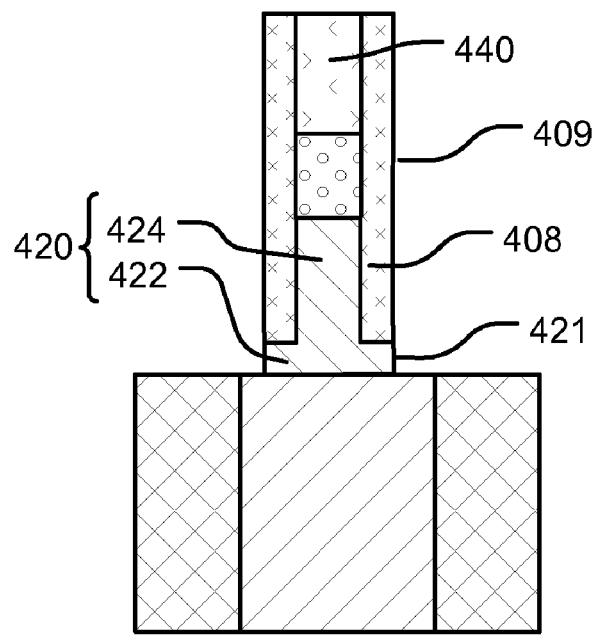

Next, the layer 1400 is etched using the dielectric spacer 408 as an etch mask, resulting in the structure illustrated in FIG. 18 having an inverted T-shaped bottom electrode 420 including a base portion 422 and a pillar portion 424 on the base portion 422. The bottom electrode 420, memory element 430, and top electrode 440 form a memory core.

Since the layer 1400 is etched using the dielectric spacer 408 as an etch mask, the base portion 422 of the bottom electrode 420 has an outer surface 421 self-aligned with the outer surface 409 of the dielectric spacer 408.

In FIG. 18 the bottom electrode 420 comprises material that can be selectively etched from that of material of the top electrode 440, and thus the top electrode 440 is also used as an etch mask during the etching of layer 1400. Alternatively, the top electrode 440 may also be etched.

In an alternative embodiment a suitable hard mask layer is deposited on the top electrode material layer 1420 of FIG. 14 and the mask element 1430 is formed on the hard mask layer, and the subsequent etching step of FIG. 15 results in a portion of the hard mask layer remaining on the multi-layer stack 1530. This remaining portion of the hard mask layer protects the top electrode 440 during the etching of layer 1400.

Figure 19:
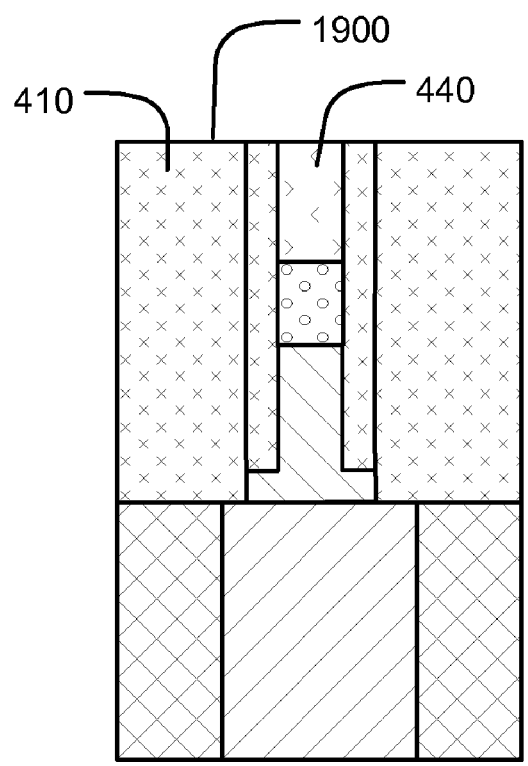

Next, a layer 410 of dielectric material is formed on the structure illustrated in FIG. 18 and planarized, resulting in the structure illustrated in FIG. 19 having a top surface 1900.

Layer 410 is formed in one embodiment by high-density plasma chemical vapor deposition (HDP CVD), followed by chemical-mechanical polishing (CMP) to expose the top electrode 440. In one embodiment the dielectric 410 comprises silicon dioxide formed by chemical vapor deposition using a silane and $O_2$ chemistry at 400 to 450 C. For embodiments in which the dielectric 410 is silicon nitride, a similar process is used with ammonia added instead of silane. For oxynitride, one should use ammonia, silane and oxygen. The dielectric 410 may comprise silicon oxides, silicon nitrides and other insulating materials, preferably having good thermal as well as electrical insulating properties.

Next, subsequent further processing such as forming a bit line coupled to the memory cell can then be done.

Figure 20:
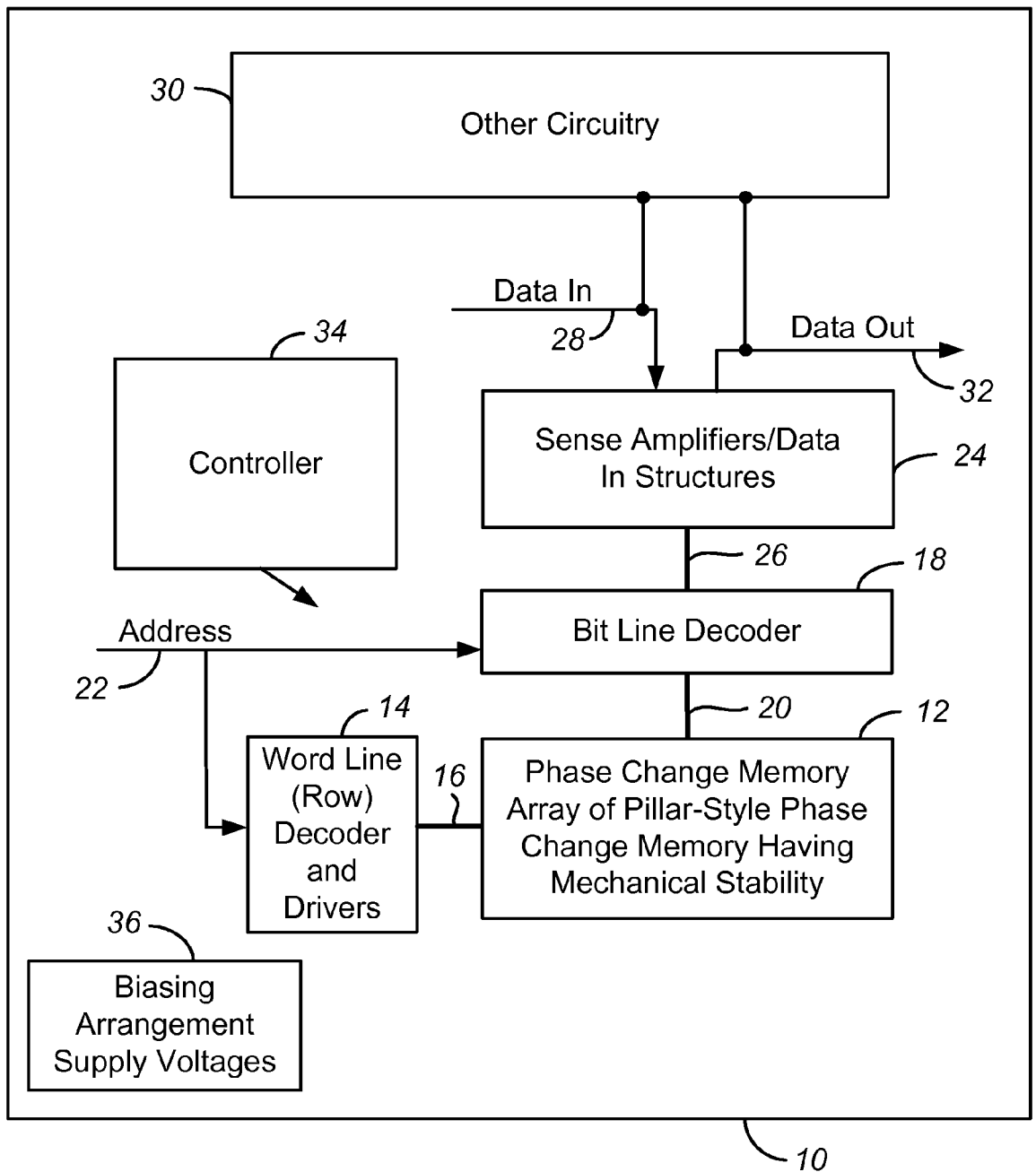
FIG. 20 is a simplified block diagram of an integrated circuit including a memory array implemented using memory cells as described herein.

FIG. 20 is a simplified block diagram of an integrated circuit 10 including a memory array 12 implemented using memory cells as described herein with reference to FIGS. 3 or 4. A word line decoder 14 is coupled to and in electrical communication with a plurality of word lines 16. A bit line (column) decoder 18 is in electrical communication with a plurality of bit lines 20 to read data from, and write data to, the phase change memory cells (not shown) in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 21:
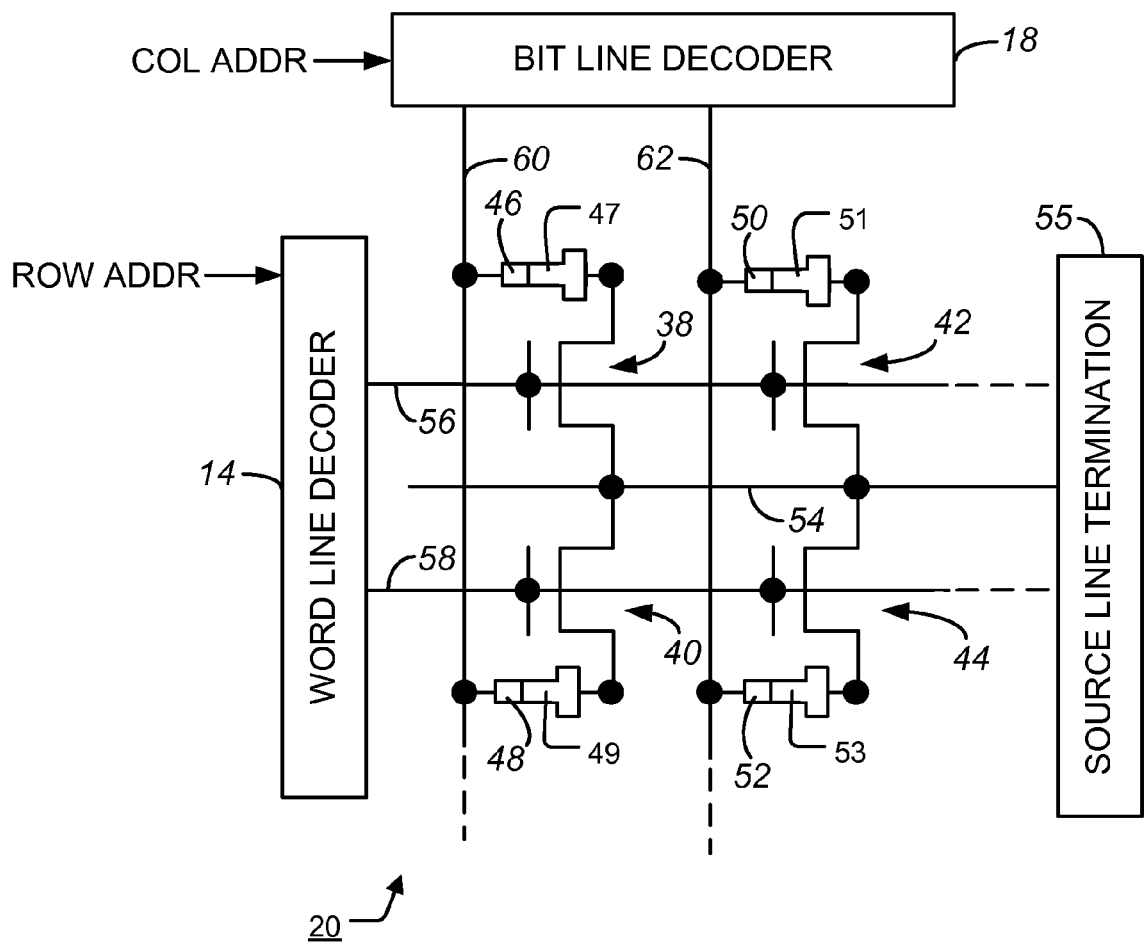
FIG. 21 is a portion of a memory array implemented using memory cells described herein.

As shown in FIG. 21 each of the memory cells of array 12 includes an access transistor (or other access device such as a diode), four of which are shown as 38, 40, 42 and 44, a phase change element shown as 46, 48, 50 and 52, and inverted T-shaped bottom electrode shown as 47, 49, 51, and 53. Sources of each of the access transistors 38, 40, 42 and 44 are connected in common to a source line 54 that terminates in a source line termination 55. In another embodiment the source lines of the select devices are not electrically connected, but independently controllable. A plurality of word lines including word lines 56 and 58 extend parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality 20 of bit lines including bit lines 60 and 62 have one end of phase change elements 46 and 48 connected to bit line 60. Specifically, phase change element 46 is connected between the drain of access transistor 38 and bit line 60, and phase change element 48 is connected between the drain of access transistor 48 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to source. Additionally, instead of MOS transistors, bipolar transistors or diodes may be used as an access device.

The invention has been described with reference to phase change materials. However, other memory materials, also sometimes referred to as programmable materials, can also be used. As used in this application, memory materials are those materials having electrical properties, such as resistance, that can be changed by the application of energy; the change can be a stepwise change or a continuous change or a combination thereof.

While the present disclosure is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the disclosure and the scope of the following claims.

We claim:

1. A memory cell comprising:
   a bottom electrode comprising a base portion and a pillar portion on the base portion, the pillar portion and the base portion having respective outer surfaces and the pillar portion having a width less than that of the base portion;
   a memory element on a top surface of the pillar portion of the bottom electrode, the memory element having a width substantially the same as that of the pillar portion;
   a top electrode on the memory element, the top electrode having a width substantially the same as that of the memory element; and
   a dielectric spacer contacting the outer surface of the pillar portion, memory element, the top electrode, and the outer surface of the base portion of the bottom electrode self-aligned with an outer surface of the dielectric spacer.

2. The memory cell of claim 1, wherein the width of the pillar portion is less than a minimum feature size for a lithographic process used to form the memory cell.

3. The memory cell of claim 1, wherein the top and bottom electrode each comprise an element chosen from a group consisting of Ti, W, Mo, Al, Ta, Cu, Pt, Ir, La, Ni, N, O, and Ru and combinations thereof.

4. The memory cell of claim 1, wherein the memory material comprises a combination of two or more materials from a group consisting of Ge, Sb, Te, Se, In, Ti, Ga, Bi, Sn, Cu, Pd, Pb, Ag, S, Si, O, P, As, N and Au.

5. The memory cell of claim 1, wherein the memory element and the top electrode form a multi-layer stack having a width greater than that of the pillar portion of the bottom electrode.

6. The memory cell of claim 1, wherein the memory element and the top electrode have respective widths substantially equal to that of the pillar portion of the bottom electrode.

7. The memory cell of claim 6, wherein the dielectric spacer contacts an outer surface of the memory element and an outer surface of the top electrode.

8. The memory cell of claim 7, wherein the dielectric spacer surrounds the pillar portion of the bottom electrode and the memory element.

9. The memory cell of claim 1, wherein the dielectric spacer has a thermal conductivity less than that of the memory material.

10. A method for manufacturing a memory cell, the method comprising:
   forming a memory core including:
      a bottom electrode comprising a base portion and a pillar portion on the base portion, the pillar portion and the base portion having respective outer surfaces and the pillar portion having a width less than that of the base portion;
      a memory element on a top surface of the pillar portion of the bottom electrode, the memory element having a width substantially the same as that of the pillar portion; and
      a top electrode on the memory element, the top electrode having a width substantially the same as that of the memory element; and
   forming a dielectric spacer contacting the outer surface of the pillar portion, the memory element, the top electrode, and the outer surface of the base portion of the bottom electrode self-aligned with an outer surface of the dielectric spacer.

11. The method of claim 10, wherein the width of the pillar portion is less than a minimum feature size for a lithographic process used to form the memory cell.

12. The method of claim 10, wherein the step of forming a memory core comprises:
   forming a layer of memory material on the bottom electrode;
   forming a layer of top electrode material on the layer of memory material; and
   patterning the layer of memory material and the layer of top electrode material to form a multi-layer stack comprising the memory element and the top electrode.

13. A method for manufacturing a memory cell, the method comprising:
   forming a memory core including:
      a bottom electrode comprising a base portion and a pillar portion on the base portion, the pillar portion and the base portion having respective outer surfaces and the pillar portion having a width less than that of the base portion;
      a memory element on a top surface of the pillar portion of the bottom electrode; and
      a top electrode on the memory element; and
   forming a dielectric spacer contacting the outer surface of the pillar portion, the outer surface of the base portion of the bottom electrode self-aligned with an outer surface of the dielectric spacer, wherein the step of forming a memory core and the step of forming a dielectric spacer comprise:
   providing a memory access layer having a top surface, the memory access layer including a conductive plug extending to the top surface of the memory access layer;
   forming a layer of bottom electrode material on the top surface of the memory access layer;
   forming an etch mask overlying the layer of bottom electrode material;
   etching through a portion of the layer of bottom electrode material using the etch mask, thereby forming a partially etched layer including a pillar of bottom electrode material;
   forming a layer of dielectric spacer material overlying the partially etched layer; and
   etching the layer of dielectric spacer material and the partially etched layer to form the dielectric spacer and the bottom electrode.

14. The method of claim 13, wherein the etching the layer of dielectric spacer material and the partially etched layer comprise:
   anisotropically etching the layer of dielectric spacer material to form the dielectric spacer; and
   etching the partially etched layer using the dielectric spacer as an etch mask, thereby forming the bottom electrode.

15. A method for manufacturing a memory cell, the method comprising:
   forming a memory core including:
      a bottom electrode comprising a base portion and a pillar portion on the base portion, the pillar portion and the base portion having respective outer surfaces and the pillar portion having a width less than that of the base portion;
      a memory element on a top surface of the pillar portion of the bottom electrode; and
      a top electrode on the memory element; and
   forming a dielectric spacer contacting the outer surface of the pillar portion, the outer surface of the base portion of the bottom electrode self-aligned with an outer surface of the dielectric spacer, wherein the step of forming a memory core comprises:
   providing a memory access layer having a top surface, the memory access layer including a conductive plug extending to the top surface of the memory access layer;
   forming a layer of bottom electrode material on the top surface of the memory access layer;
   forming a layer of memory material on the layer of bottom electrode material;
   forming a layer of top electrode material on the layer of memory material;
   forming an etch mask on the layer of top electrode material;
   etching down through a portion of the layer of bottom electrode material using the etch mask, thereby forming a partially etched layer including a pillar of bottom electrode material and a multi-layer stack on the pillar of bottom electrode material, the multi-layer stack comprising a memory element comprising memory material on the pillar of bottom electrode material and a top electrode comprising top electrode material on the memory element.

16. The method of claim 15, wherein the multi-layer stack has a width substantially equal to that of the pillar portion of the bottom electrode.

17. A method for manufacturing a memory cell, the method comprising:
   providing a memory access layer having a top surface, the memory access layer including a conductive plug extending to the top surface of the memory access layer;
   forming a layer of bottom electrode material on the top surface of the memory access layer;
   forming a layer of memory material on the layer of bottom electrode material;
   forming a layer of top electrode material on the layer of memory material;
   forming an etch mask on the layer of top electrode material;

etching down through a portion of the layer of bottom electrode material using the etch mask, thereby forming a partially etched layer including a pillar of bottom electrode material and a multi-layer stack on the pillar of bottom electrode material, the multi-layer stack comprising a memory element comprising memory material on the pillar of bottom electrode material and a top electrode comprising top electrode material on the memory element;

forming a layer of dielectric spacer material on the partially etched layer and the multi-layer stack;

anisotropically etching the layer of dielectric spacer material to form a dielectric spacer contacting an outer surface of the pillar of bottom electrode material and an outer surface of the multi-layer stack; and etching the partially etched layer using the dielectric spacer as an etch mask, thereby forming a bottom electrode comprising a base portion and a pillar portion on the base portion.

\* \* \* \* \*